United States Patent
Kato

(10) Patent No.: US 6,970,763 B2
(45) Date of Patent: Nov. 29, 2005

(54) CIRCUIT BOARD MANUFACTURING APPARATUS WITH PROTECTION FUNCTION FOR SUPERVISING/ADJUSTING MODE AND METHOD OF OPERATING THE APPARATUS

(75) Inventor: Mitsuaki Kato, Anjyo (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 47 days.

(21) Appl. No.: 10/389,955

(22) Filed: Mar. 18, 2003

(65) Prior Publication Data

US 2003/0225472 A1   Dec. 4, 2003

(30) Foreign Application Priority Data

Mar. 18, 2002   (JP) ............................ 2002-119933

(51) Int. Cl.[7] .......................................... G06F 17/00
(52) U.S. Cl. ............................. 700/180; 715/743
(58) Field of Search .......... 700/79, 180; 345/741–743; 713/200; 715/741–743

(56) References Cited

U.S. PATENT DOCUMENTS

| | | | | |
|---|---|---|---|---|
| 5,283,943 A | * | 2/1994 | Aguayo et al. ............... | 29/701 |
| 5,471,616 A | * | 11/1995 | Johnson et al. ............. | 713/200 |
| 6,513,111 B2 | * | 1/2003 | Klimczak et al. .............. | 713/1 |
| 6,684,264 B1 | * | 1/2004 | Choi ........................... | 710/15 |
| 2002/0067370 A1 | * | 6/2002 | Forney et al. ............... | 345/742 |
| 2002/0112174 A1 | * | 8/2002 | Yager et al. ................. | 713/200 |
| 2002/0118228 A1 | * | 8/2002 | Bergo et al. ................. | 345/765 |
| 2003/0074575 A1 | * | 4/2003 | Hoberock et al. .......... | 713/200 |
| 2003/0132958 A1 | * | 7/2003 | Himmel et al. .............. | 345/745 |
| 2003/0137535 A1 | * | 7/2003 | Heo ........................... | 345/741 |
| 2004/0015963 A1 | * | 1/2004 | Huber ........................ | 717/178 |

FOREIGN PATENT DOCUMENTS

| | | |
|---|---|---|
| JP | 05-274270 | 10/1993 |
| JP | 2000-315189 | 11/2000 |

* cited by examiner

Primary Examiner—Maria N. Von Buhr
(74) Attorney, Agent, or Firm—Oblon, Spivak, McClelland, Maier & Neustadt, P.C.

(57) ABSTRACT

A circuit board manufacturing apparatus and a method of operating the same include a protection function for preventing a supervising/adjusting mode to which a limited user only is accessible, from being altered where the mode is left without being logged off. The apparatus and the method include a job mode in which the manipulation is allowed to be performed by general operators who have an authority to operate the apparatus and a supervising/adjusting mode in which the manipulation is not allowed by general operators, but is allowed only to a specified user. In the case that the apparatus is placed in the supervising/adjusting mode, a protection control is executed to automatically terminate the supervising/adjusting mode when a predetermined time period expires to prevent manipulation in that mode from being performed by the general operators.

4 Claims, 19 Drawing Sheets

FIG. 3

| | User Name | Password | Authorities Restrained by Super User |
|---|---|---|---|
| Super User (Line Supervisor) | A | **** | — |
| General Users | B | **** | P1, P2, P3, P4. |
| | C | **** | P1, P2, P3, P4. |
| | D | **** | P1, P2, P3, P4. |
| | E | **** | P1, P2, P3, P4. |
| Default User | F | **** | P1, P2 |

263

FIG. 16  <In Case of Default User being Set>

CIRCUIT BOARD MANUFACTURING APPARATUS WITH PROTECTION FUNCTION FOR SUPERVISING/ADJUSTING MODE AND METHOD OF OPERATING THE APPARATUS

INCORPORATION BY REFERENCE

This application is based on and claims priority under 35 U.S.C. sctn. 119 with respect to Japanese Application No. 2002-119933 filed on Mar. 18, 2002, the entire content of which is incorporated herein by reference.

BACKGROUND OF THE INVENTION

1. Field of the Invention

The present invention relates to an electronic parts assembling apparatus having a supervising/adjusting mode and an operating method therefor.

2. Discussion of the Related Art

At a job site where circuit board manufacturing apparatus such as electronic parts assembling apparatus are used, it has been a practice that the operators for computers (terminals) incorporated into the manufacturing apparatus are distinguished into usually one line supervisor (called as "super user") for supervising the circuit board manufacturing apparatus and usually plural general operators (called as "general users") for bringing the manufacturing apparatus into operation under the direction of the line supervisor.

In this case, with respect to the operation of the manufacturing apparatus, the line supervisor is given all of the authorities for line management including "supervising/adjusting" the apparatus, whereas the general operators are given only the authority to operate the apparatus on a regular basis, that is, the authority to practice the production only.

The line supervisor and the general operators make personal certifications to log in to the terminals of the manufacturing apparatus and to carry out input manipulation by means of a touch panel display. In the case of the general operators, the authority for manipulation is restrained because only those input and output screens which meet the authority given to him or her are displayed during the manipulation.

The reason why the levels of the authority are made different like this is to make the roles of those responsible for the line definite (i.e., making the responsible person identical to the line supervisor) and to enable beginners to perform their works easily as general operators.

On the other hand, it has been known as described in for example Japanese unexamined, published patent applications No. 5-274270 (1993-274270) and No. 2000-315189 that when a predetermined time period passes without any manipulation in the state that a user is enabled to manipulate a computer upon completion of logging-in with certification, the user in the log in state is automatically logged off of the computer.

It may be often the case that the line supervisor for a manufacturing apparatus leaves his or her job site for some reason during log-in in a supervising/adjusting mode or he or she may go home without performing logging-off. In this case, it may happen that a general operator erroneously manipulates the screens relating to the "supervising/adjusting" dedicated to the line supervisor and alters the settings of the apparatus for which he is not authorized. This may give raise to serious problems such as the stopping and malfunction of the manufacturing apparatus, the manufacturing of inferior goods, accident and the like.

In addition, the same problem as above may take place in a computer system of the field wherein there exist a superior supervisor who is given a special authority to supervise the entire system and general operators who utilize individual terminals of the system.

SUMMARY OF THE INVENTION

It is therefore a primary object of the present invention to provide a circuit board manufacturing apparatus and an operating method therefor having a supervising/adjusting mode protection function capable of preventing settings from being altered due to the supervising/adjusting mode left without being logged off.

Another object of the present invention is to provide a circuit board manufacturing apparatus and an operating method therefor having a supervising/adjusting mode protection function which does not make causes to obstruct the progress of the production (the apparatus operation) as well as to lower the production efficiency.

A further object of the present invention is to provide a computer system of the type having a plurality of terminals connected via a network wherein there is provided a supervising/adjusting mode protection function capable of preventing settings from being altered due to the supervising/adjusting mode left without being logged off.

Briefly, the present invention provides a circuit board manufacturing apparatus and a method of operating the same, which includes a computer for controlling the apparatus and has a job mode in which a general operator who is given an authority relating to the operation of the apparatus is allowed to perform the manipulation and a supervising/adjusting mode in which the general operator is not authorized to manipulate the computer, but a specified user is authorized to manipulate the computer. In the apparatus and the method, a protection control is executed to automatically terminate the supervising/adjusting mode when a predetermined time period expires in the state that the manipulation in connection with the supervising/adjusting mode is not performed with the circuit board manufacturing apparatus being placed in the supervising/adjusting mode.

According to the present invention, where a line supervisor having logged in leaves the job site over a predetermined time period, the supervising/adjusting mode is automatically logged off so as to prevent the general operator from manipulating a supervising/adjusting screen. That is, where a problem occurs in the apparatus, the line supervisor switches the apparatus with his or her password into the supervising/adjusting mode and works in the mode. However, it may be often the case that upon the problem solved, the line supervisor leaves the apparatus without entering a logoff command for the supervising/adjusting mode. In such case, the apparatus counts the time period during which no access is made, and when the counted time period reaches a predetermined time period, automatically logs off of the supervising/adjusting mode.

In one example, the time period during which the manipulation on a touch panel is not performed is counted by a timer, and a log-off is automatically generated when the counted time period reaches a predetermined time period (which makes the line supervisor assumed to have left the job site). By doing so, the foregoing drawbacks can be obviated to the utmost.

Further, even where the screens for the "supervising/adjusting" can be protected by taking measures to automatically generate the logoff command, it must be avoided that the progress of production (i.e., the operation of the apparatus) is impeded or obstructed. To this end, the following improvements are made to keep the production efficiency as high as possible.

That is, in another aspect of the present invention, there is provided a circuit board manufacturing apparatus and a method of operating the same, which includes a computer for controlling the apparatus and has a job mode in which a general operator who is given an authority relating to the operation of the apparatus is able to manipulate the computer and a supervising/adjusting mode in which the general operator is not authorized to manipulate the computer, but a specified user is authorized to manipulate the computer. The apparatus and the method is provided with an automatic logoff function which is capable of automatically logging off the supervising/adjusting mode immediately if the operation of the apparatus according to a prior command has been terminated when a predetermined time period expires in the state that no manipulation is performed in connection with the supervising/adjusting mode, and for automatically logging off the supervising/adjusting mode after the operation of the apparatus according to the prior command is terminated if the operation of the apparatus according to the prior command is continued when the predetermined time expires in the state that no manipulation is performed in connection with the supervising/adjusting mode. Preferably, the automatic logging off is not executed while the general operator has logged in to the computer.

In the automatic logoff function, the display screen panel is switched over and by reference to an internal clock, the logging off is automatically executed to alter the panel for a default user. If the default user cannot perform the manipulation on the panel, or any default user has not been set, the logging in to the computer is executed by the super user to alter or adjust the settings on the supervising/adjusting panel, and at the expiration of a waiting time, the supervising/adjusting panel is altered to a login panel, upon which a user having an authority to access thereto can enter a re-login command again. Where the re-login command is not entered, an emergency stop switch is pressed to carry out the shutdown of the computer, and after the re-stating of the same, the login command can be entered by a general operator.

On the screen after the automatic logging is executed, a user who has logged in with his or her certification is able to carry out manipulation. When the predetermined time period expires in the state that any manipulation has not been performed, the user who has presently logged in is automatically logged off, and instead, another user (e.g., a default user) designated in advance is automatically logged in without his or her certification.

In the automatic logoff function according to the present invention, if the production according to a prior command is continued even when the time period set for the automatic logging off expires, the logging off is executed upon the termination of the production, whereby there can be obviated such shortcomings that the production is discontinued by the use of the automatic logoff function.

In addition, the automatic login function is executed under the condition that a default user has been set. Where any default user has not been set, a re-login accepting screen is displayed after the automatic logging off is executed. In this case, a user who is allowed to re-log in is limited to the user who had an authority to manipulate the last touch panel screen before the logging off.

Consequently, when the line supervisor comes back to the job site in a hurry, he or she is allowed to re-login immediately without carrying out the shutdown of the computer for the purpose of returning to the previous manipulation operations.

In a further aspect of the invention, the users who are allowed to re-log in are displayed on the re-login accepting screen for selection. This advantageously makes it clear who is allowed to re-log in, so that the manipulation required to re-log in can be done easier than that required for the usual logging in.

In a still further aspect of the invention, even in the case that the default user has been set, the automatic logging in is not executed and instead, the re-login accepting screen is displayed if the screen manipulated lastly before the automatic logoff was that relating to the supervising/adjusting screen. The fact that manipulated lastly was the supervising/adjusting screen means the possibility that the super user left the job site with the setting on the supervising/adjusting screen being left insufficient, and therefore, the production operation can be discontinued in such case, so that the manufacturing of inferior goods can advantageously be prevented.

BRIEF DESCRIPTION OF THE ACCOMPANYING DRAWINGS

The foregoing and other objects and many of the attendant advantages of the present invention may readily be appreciated as the same becomes better understood by reference to the following detailed description of preferred embodiments of the present invention when considered in connection with the accompanying drawings, wherein like reference numerals designate the same or corresponding parts throughout several views, and in which:

FIG. 3 is an explanatory view showing an example of a list registering a line supervisor, general operators and a default user;

FIG. 4 is an explanatory view illustrating the hierarchy of display screens (touch panel screens) in an input mode after the super user logged in;

DETAILED DESCRIPTION OF THE PREFERRED EMBODIMENTS

A preferred embodiment of the present invention will be described hereinafter with reference to the accompanying drawings.

Figure 1:
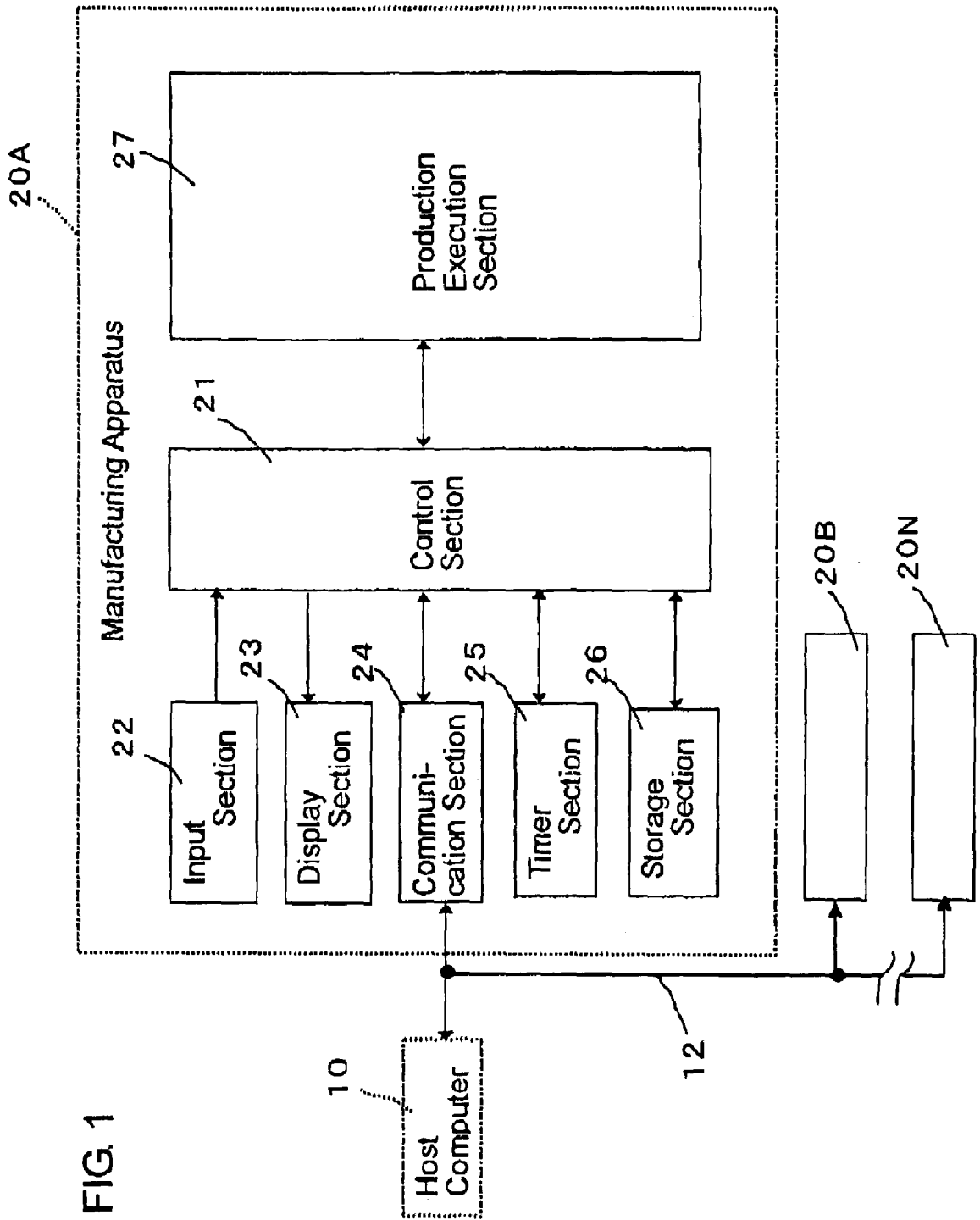
FIG. 1 is a block diagram of a circuit board manufacturing apparatus with a supervising/adjusting mode protection function as one embodiment according to the present invention.

Referring now to the drawings, and more particularly to FIG. 1, there is shown a block diagram of a circuit board manufacturing apparatus having a supervising/adjusting mode protection function of an embodiment according to the present invention. A numeral 10 denotes a host computer (a control server for the manufacturing apparatus) which supervisingly controls a plurality of circuit board manufacturing apparatus 20 (lines 20A to 20N) via a communication network 12. Each circuit board manufacturing apparatus 20 comprises a control section 21, an input section 22, a display section 23, a communication section 24, a timer section 25, a storage section 26 and a production execution section 27. The configuration of the circuit board manufacturing apparatus 20 except for the production execution section 27 is embodied by, for example, a computer provided with a CPU, a memory, programs and input and output means. The display section 23 includes a touch panel display (a supervising/adjusting panel) having a part of the functions that the input section 22 carries out.

The control section 21 is provided as the functions to be executed thereby with a "supervising/adjusting mode" in which the alteration of settings and adjusting can be done and a "production mode" in which production operation can be executed at least. Users (operators) of the circuit board manufacturing apparatus 20 are individually supervised in their user names and passwords for logging-in and have respective commands assigned thereto which are possible for respective users to execute. When one of the lines 20A through 20N under the control of the line supervisor is involved in troubles, he comes up to the troubled line or apparatus and logs in to the supervising/adjusting mode so as to perform adjustment and setting alteration. In addition to conventional control concerning the circuit board manufacturing apparatus 20, the control section 21 executes an automatic logoff/login function and an automatic login function which are features of the present invention. Herein, the term "login" or "log in" has the same meaning as the term "logon" or "log on" as used in the field concerned.

The communication section 24 controls the communication with the host computer 10 and the like via the network 12. More specifically, the communication section 24 operates to receive a new "production program" sent from the host computer 10 and to transmit the operation state information on the circuit board manufacturing apparatus 20 to the host computer 10 for centralized management of the production state at the host computer 10.

The timer section 25 includes a timer for counting the time during which the touch panel is left not to be manipulated. The timer section 25 resets its time count each time it is made known of the manipulation of the touch panel. When the time count reaches a predetermined time period, such is informed to the control section 21, whereby the automatic logoff function is executed as will be described later in detail.

The production execution section 27 comprises the mechanical section of the manufacturing apparatus 20 which section performs loading and unloading circuit boards and mounting electronic parts on the loaded circuit boards.

Figure 2:
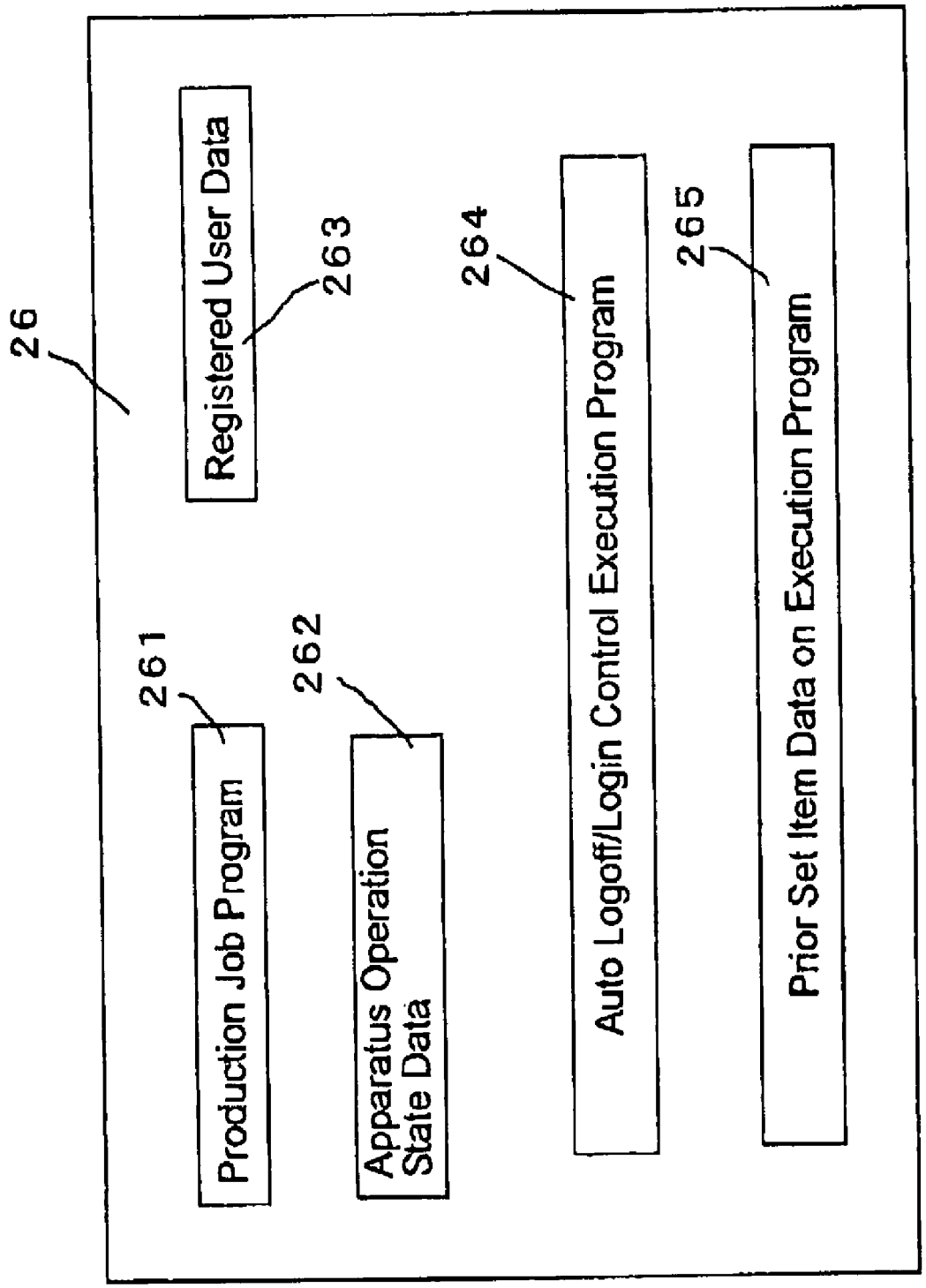
FIG. 2 is an explanatory view showing the configuration of a storage section.

As shown in FIG. 2, programs and data necessary for the production are stored in the storage section 26. Further, programs and data for executing the automatic logoff function, the automatic login function and the like which feature the present invention are also stored in the storage section 26. In this particular embodiment, at least the following information is stored in the storage section 26.

(a)"Production Job Programs" 261

These programs specify the kinds, coordinates and mounting order of the electronic parts to be mounted on each of the circuit boards and are executed at the production execution section 27.

(b)"Apparatus Operation State Data" 262

The data represent the drive condition set for the circuit board manufacturing apparatus 20 such as, for example, the drive feed rate of a part mounting head, the kinds of nozzles to be attached, various fixed values (i.e., parameters) and the like. The data can be set or altered by the super user.

(c)"Registered User Data" 263

The data is for administrating the registered user names and passwords.

(d)"Execution Program for Control of Automatic logoff/login" 264

The program is for executing the automatic logoff function and the automatic login function featuring the present invention.

(e)"Data Items to be Set in Advance for Execution Program" 265

The data include data items which are to be set for the programs which execute the automatic logoff function and the automatic login function. For example, the data includes a predetermined time period which is to be taken for the automatic logoff function to be brought into operation. The line supervisor sets the time period.

The line supervisor, general operators and default users have been designated in advance, about which data are registered as "registered user data" 263 in the storage device 26.

FIG. 3 shows an example of a registration list for the line supervisor, general operators and default user. The general operators and the default user have the respective authorities which are restrained or limited by the super user.

The line supervisor (i.e. super user) is a user who has all the authorities regarding the manipulation and setting of the machine and usually is assumed by a supervisor or responsible person for the line. To be more exact, the line supervisor has an "authority to bring the machine into operation (automatic operation)", another "authority to alter the settings of the machine", another "authority to register and delete the general users and the default user", another "authority to set the automatic logoff (including the setting of the default user)" and other various authorities. Usually, there is designated one line supervisor, but there may be plural line supervisors if need be. The line supervisor has a particular password.

Each general user (general operator) only has an "authority to bring the machine into operation (automatic operation)". More specifically, he or she has an authority to operate and stop the machine together with auxiliary authorities necessary to continue the operation of the machine such as, for example, an authority to set new parts in short of parts. Usually, the general users are those who work for production under the control of the super user.

The default user is the user who has the same authority as the general users, but who is registered by the super user as the destination of the automatic login which is executed in succession to the automatic logoff.

Where the default user has been registered, the automatic login is executed being directed to the default user after the automatic logoff for the super user is executed. That is, the default user is to become a receiver or accepter of the automatic login which is executed after the automatic logoff for the super user.

Usually, the password for the default user is made known to all of those concerned with the line. This enables anyone concerned with the line to log in as the default user.

The general users and the default user have no authority for "maintenance". Although they basically have authorities for "production" and "setup", the functions of their authorities can be restrained by the super user, so that any authority so restrained cannot be performed.

Figure 4:
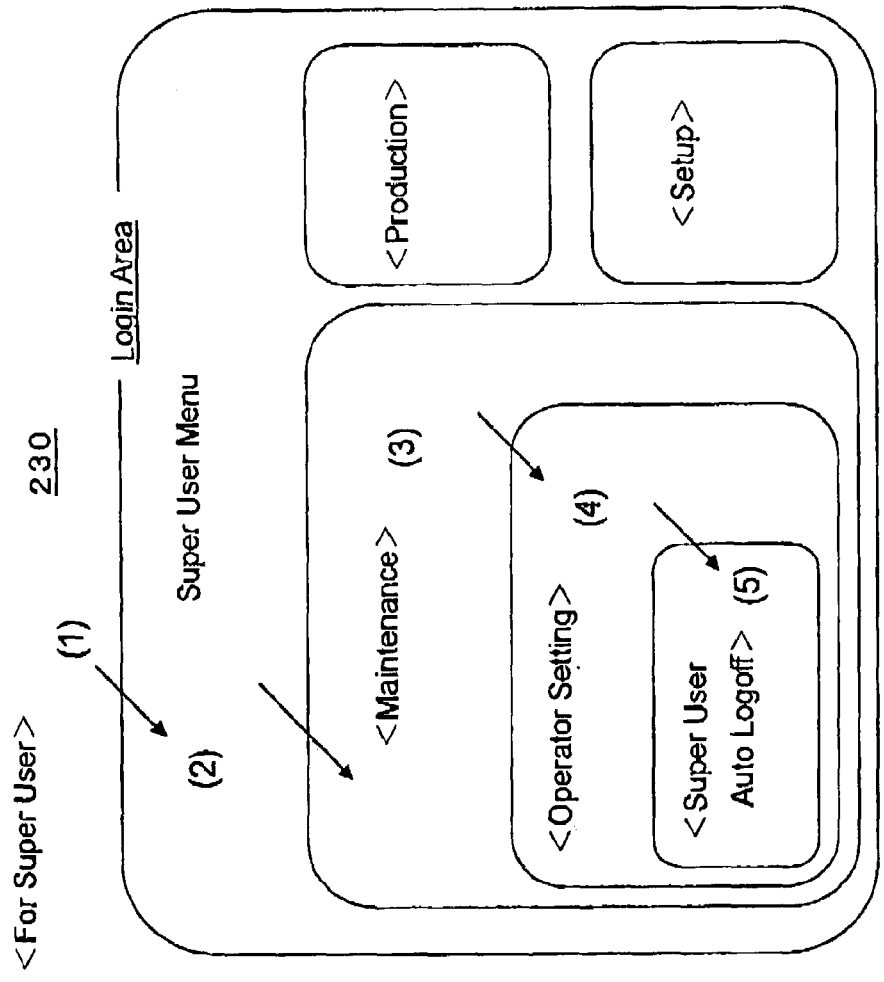

FIG. 4 shows the hierarchy in an input mode on the display screen (touch panel screen) 230 after the super user logs in. The hierarchy in the input mode includes a Login area (1), a super user menu (2), a maintenance area (3), an operator setting area (4) and a super user auto logoff area (5). The super user menu (2) contains the areas for production and setup.

Figure 5:
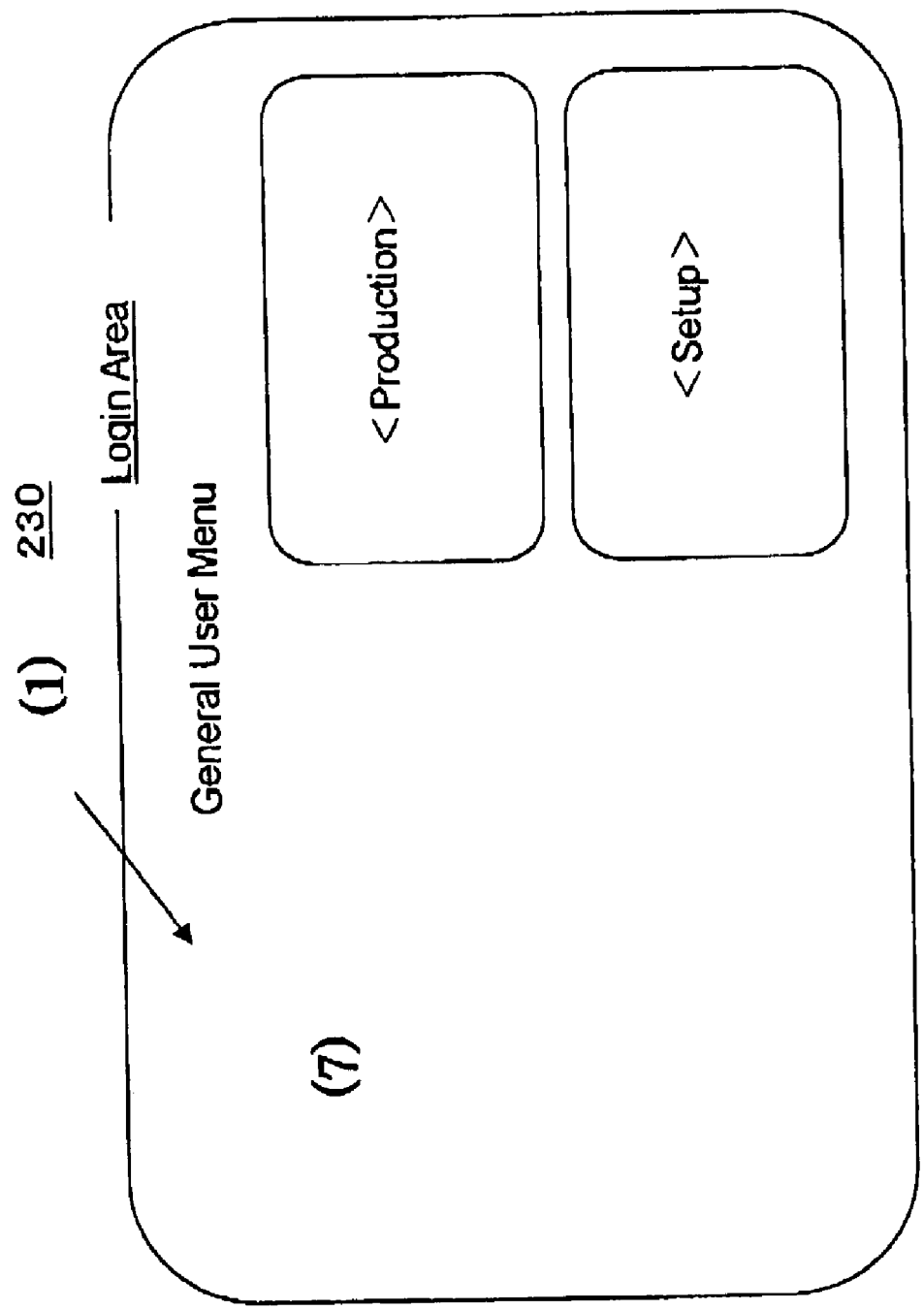
FIG. 5 is an explanatory view showing the configuration of display screens (touch panel screens) for the general users and the default user.

FIG. 5 shows a display screen (touch panel screen) 230 for the general users and the default user. The menu (7) on the display screen for the general users does not include the maintenance area (3), the operator setting area (4) and the super user auto logoff area (5) and is limited to the areas for production and setup.

More specifically, the maintenance mode is not prepared for the general users, and the intrusion into the maintenance area (3), the operator setting area (4) and the super user auto logoff area (5) is not allowed to anyone but the super user.

(Operation)

The operation of the embodiment of the circuit board manufacturing apparatus according to the present invention will be described hereinafter with reference to FIG. 6 and those successive thereto. The embodiment is assumed to be in the case that the line supervisor is administrated in the name of super user, and it is assumed that where the line supervisor left the apparatus with a supervising/adjusting panel being displayed on the screen to which the general operators are not given the authority to access, the login is to be manipulated again by the super user.

Figure 6:
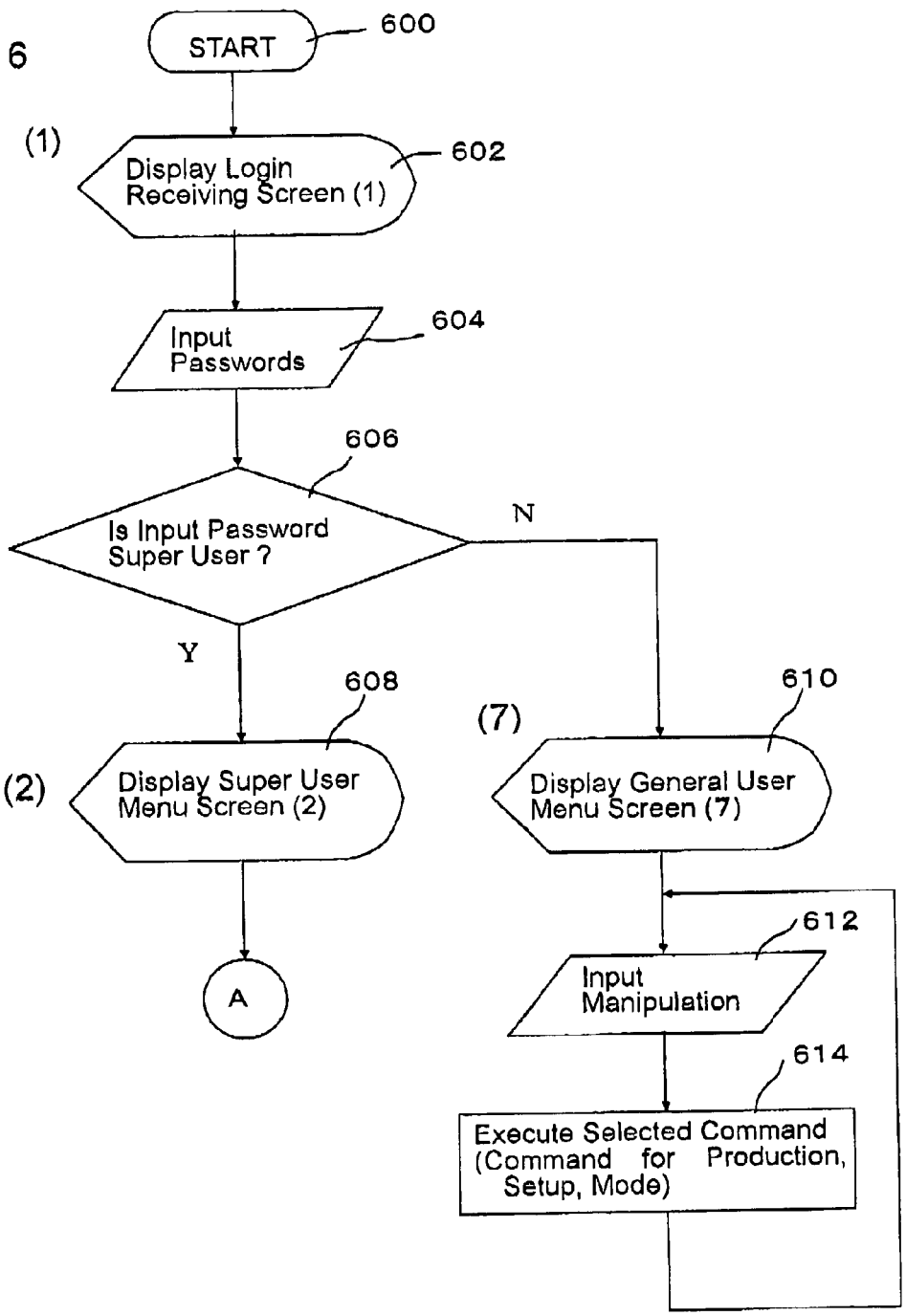
FIG. 6 is a flow chart showing an operation flow beginning from a login screen for a super user.
Figure 9:
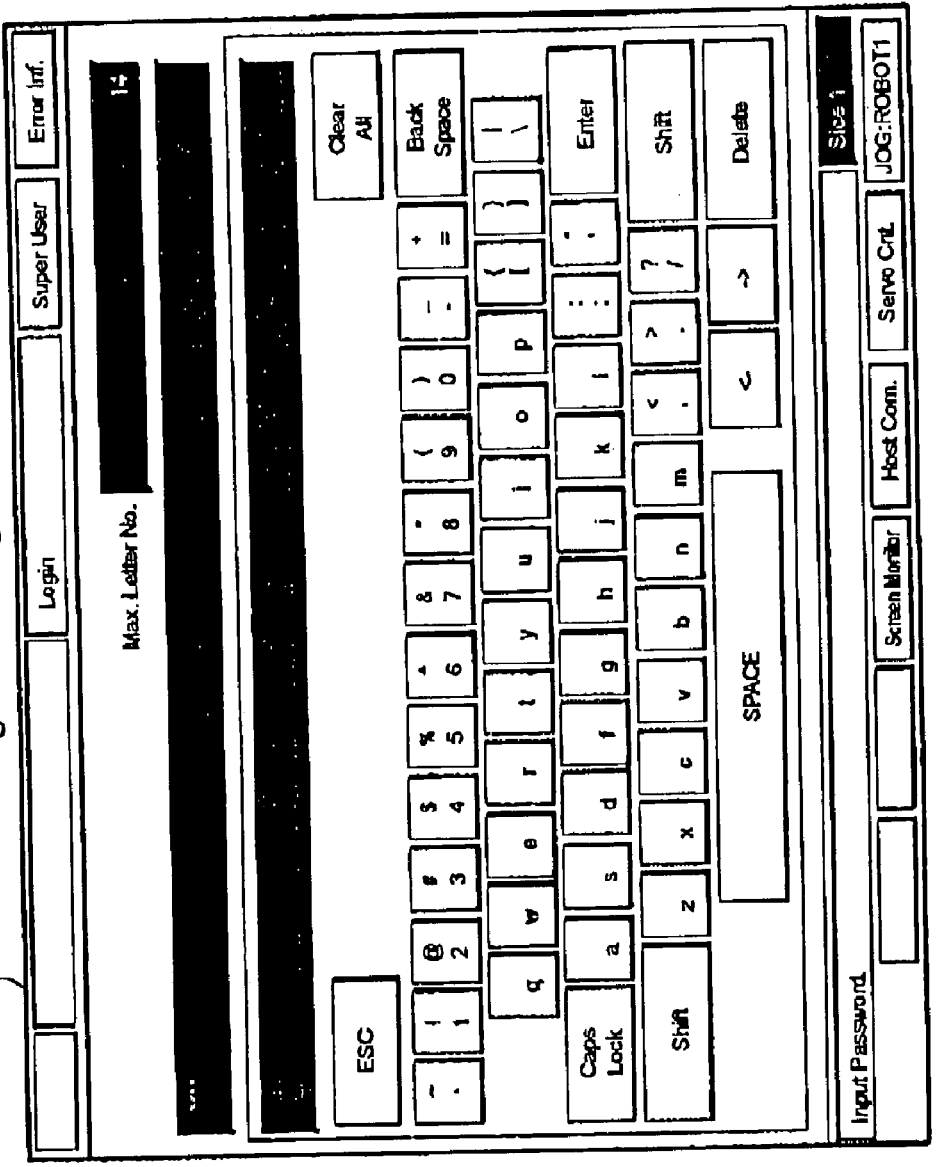
FIG. 9 is a front view showing an example of a login accepting screen (1) for the super user on a touch panel screen.

First of all, FIG. 6 is a flow chart showing the operation flow which begins from the login screen. The manipulation for login is performed on the touch panel display of the display section 23 having the function of the input section 22. (step 602) Namely, with the login screen being displayed, the super user (usually, the line supervisor) or a general operator (general user) inputs his or her password to log in. (step 604) FIG. 9 exemplifies an example of a login receiving screen on the tough panel screen for the super user. Upon his or her certification made (step 606), the routine moves to a super user menu screen (2) shown in FIG. 10 in the case of the super user (step 608) or to a general user menu screen (7) shown in FIG. 15 (step 610). The detailed description of the general user menu screen will be made later.

Figure 7:
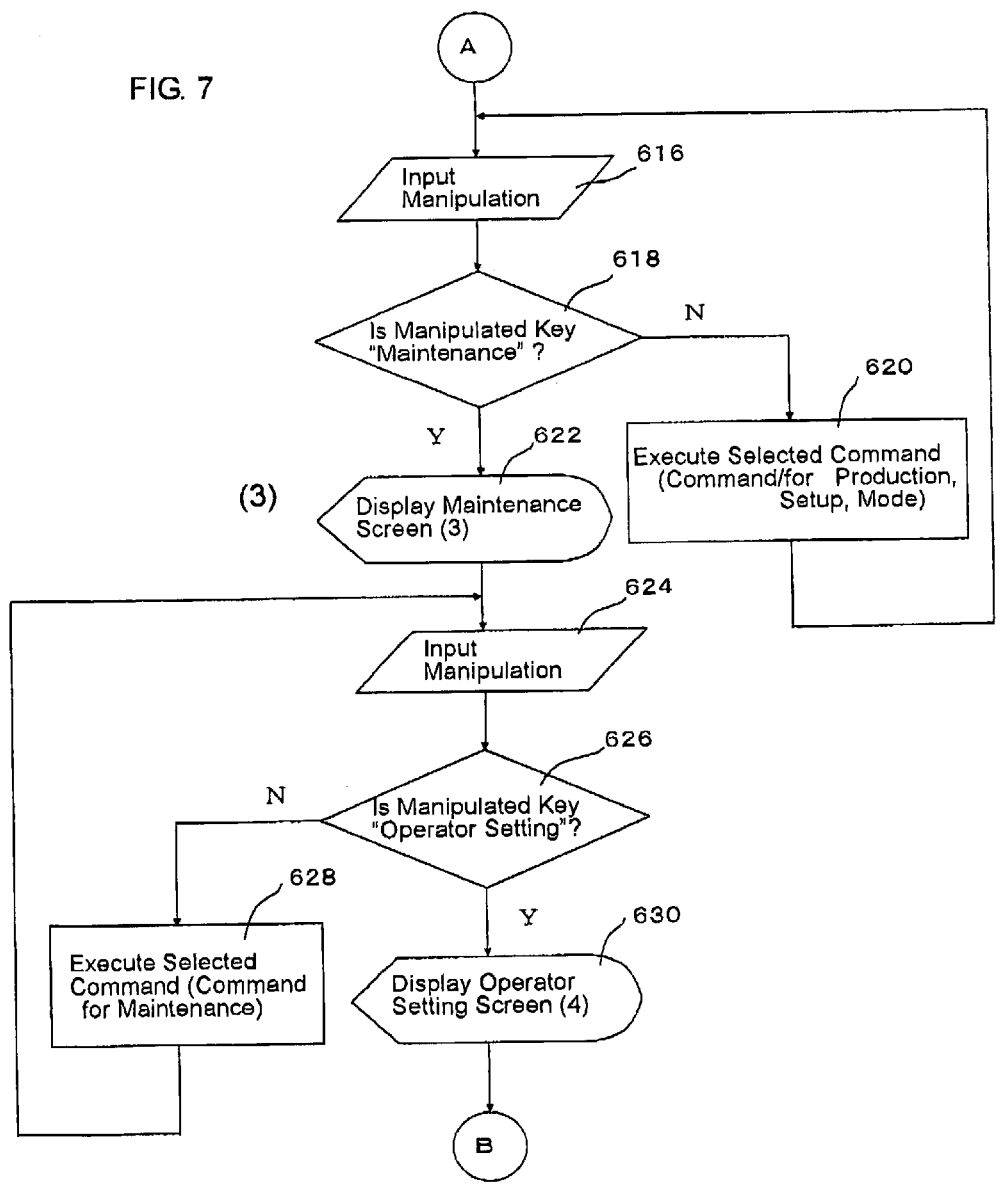
FIG. 7 is a flow chart showing the first half of an example of input manipulation, setting alteration or adjustment effected on a supervising/adjusting panel.

When the super user logs in, as shown in FIG. 7, input manipulation is done on the supervising/adjusting panel to alter the settings or adjust the same. (step 616)

Figure 10:
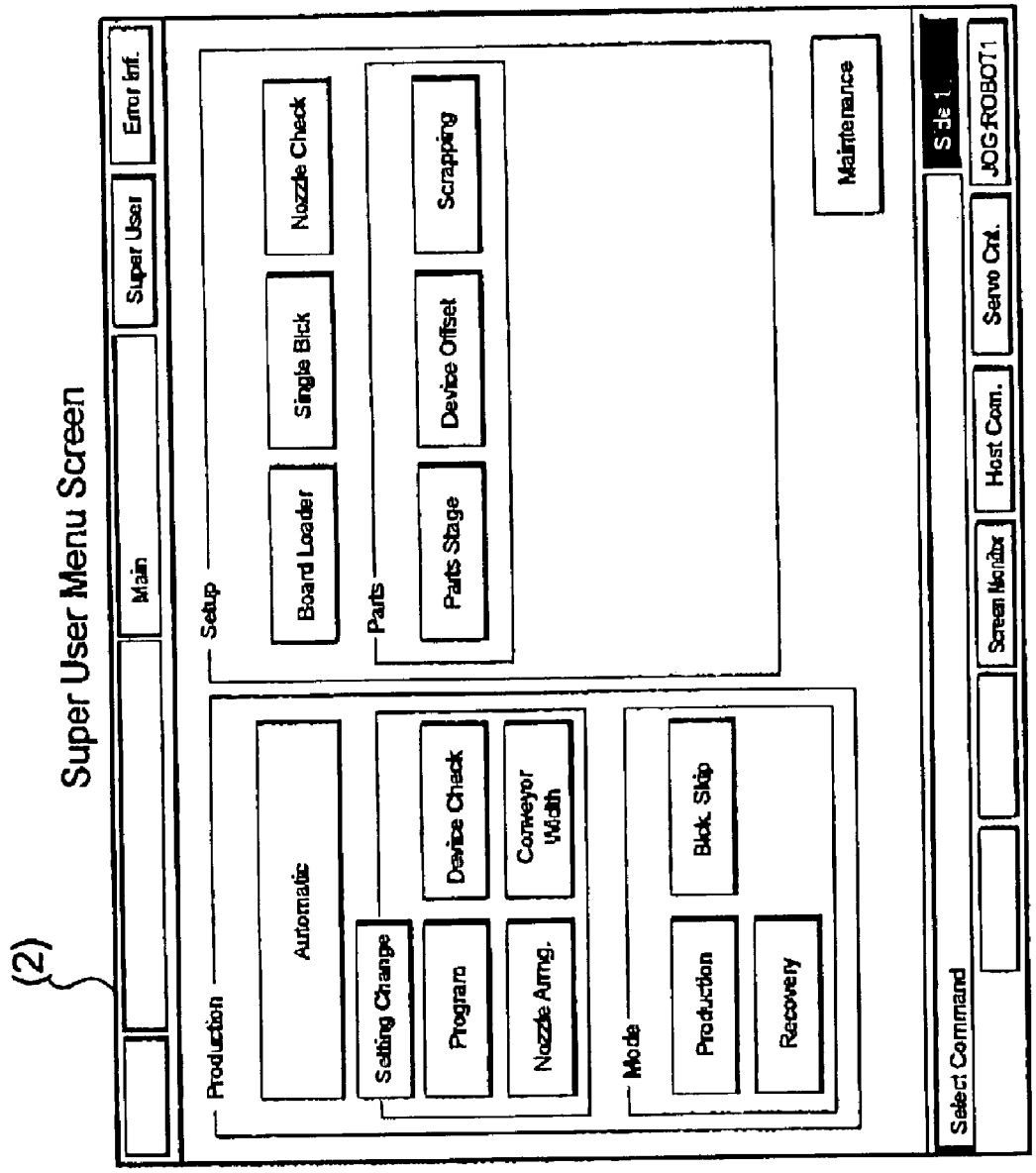
FIG. 10 is a front view showing an example of a menu screen (2) for the super user.
Figure 11:
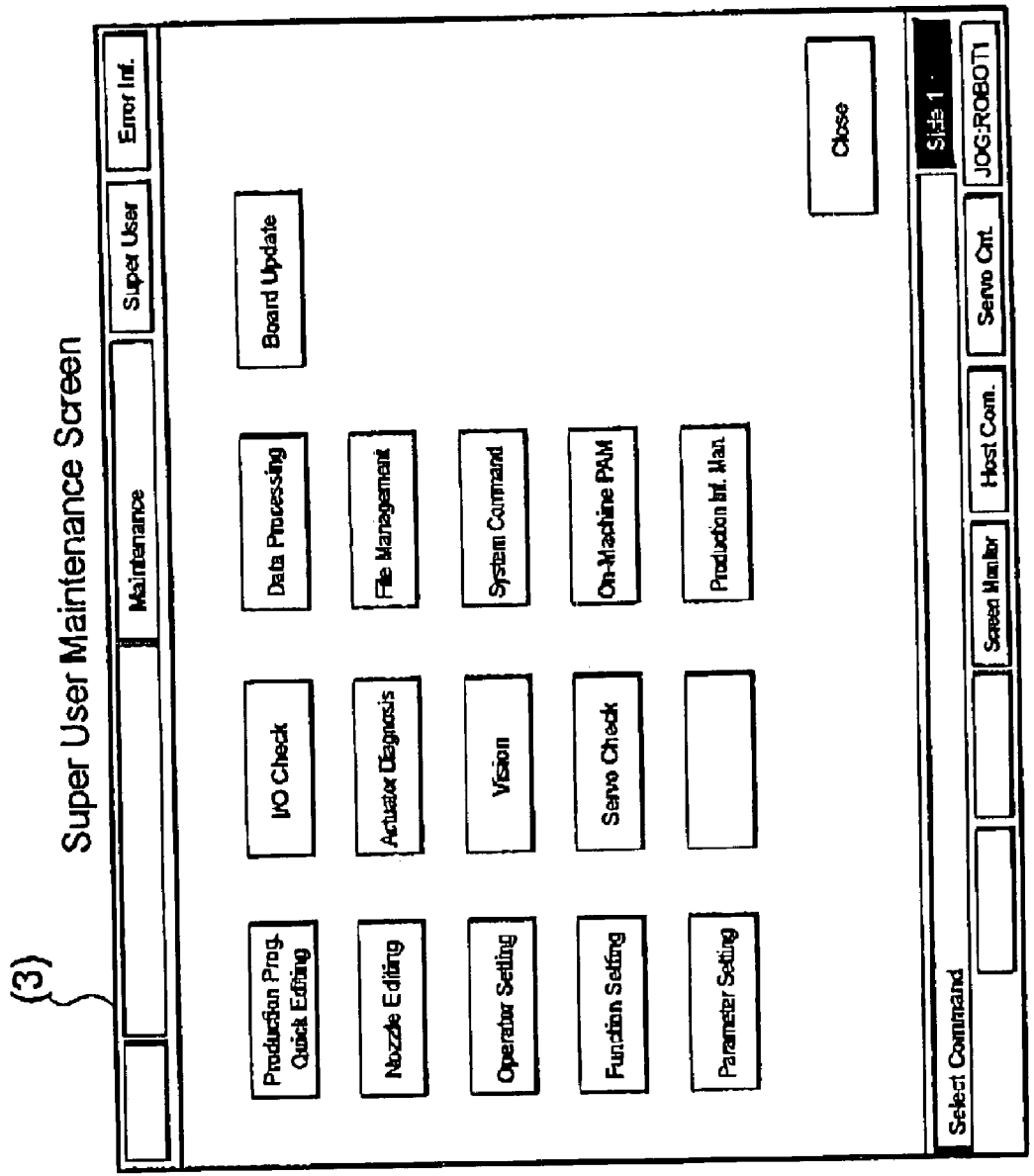
FIG. 11 is a front view showing an example of a maintenance screen (3) for the super user.
Figure 12:
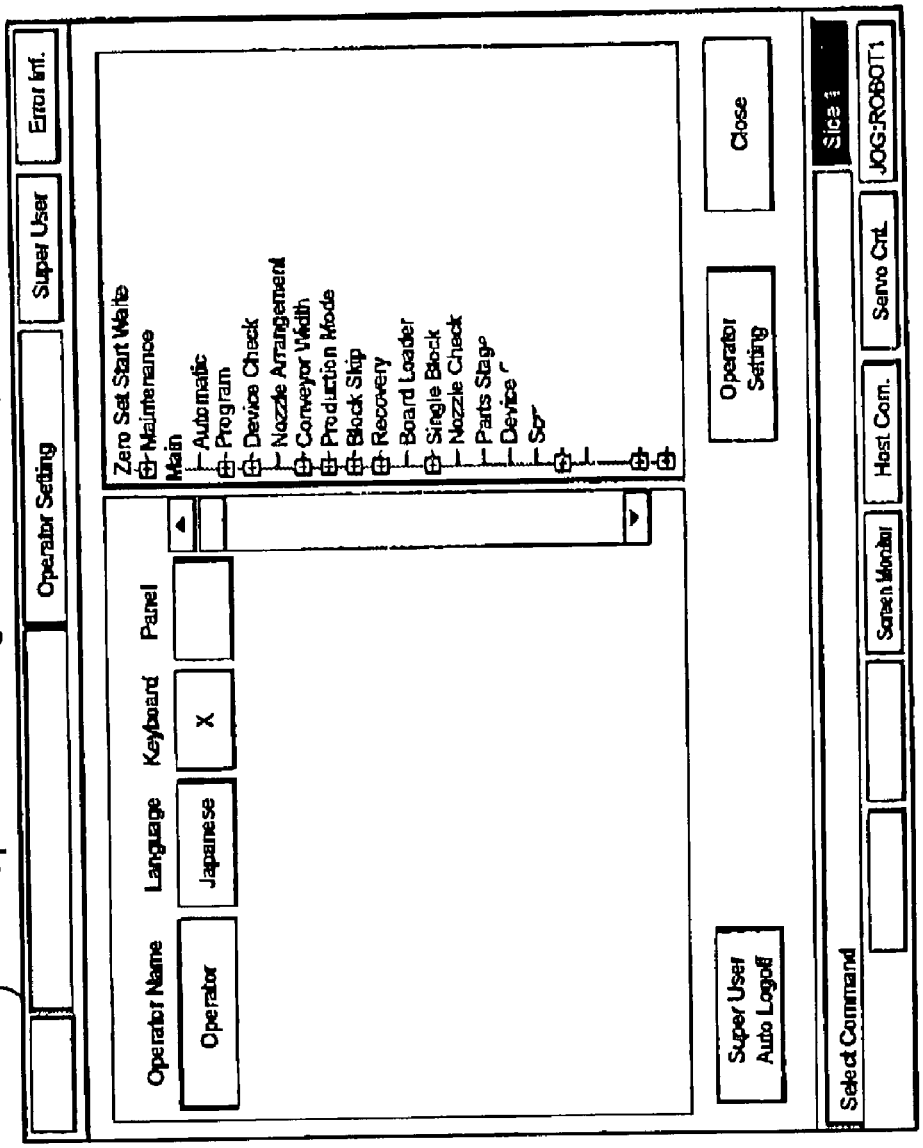
FIG. 12 is a front view showing an example of an operator setting screen (4) for the super user.

In the super user menu screen (2) shown in FIG. 10, the super user is allowed to select "Production" which comprises those commands for use in the execution of the production, "Setup" and "Maintenance" which is provided for altering the condition for the production. (step 618) The selection (step 620) of the "Maintenance" causes the routine to go to the super user maintenance screen (3) shown in FIG. 11. (step 622). Conditions and commands which can be set and/or manipulated by the super user only who is the supervisor of the manufacturing lines 20A through 20N are gathered on the super user maintenance screen (3). When the super user selects "Operator Setting" by manipulation (step 626), there is reached an operator setting screen for super user (4) shown in FIG. 12. (step 630) If selected is not "Operator Setting", commands which are related to the selected maintenance are executed. (step 628)

Figure 8:
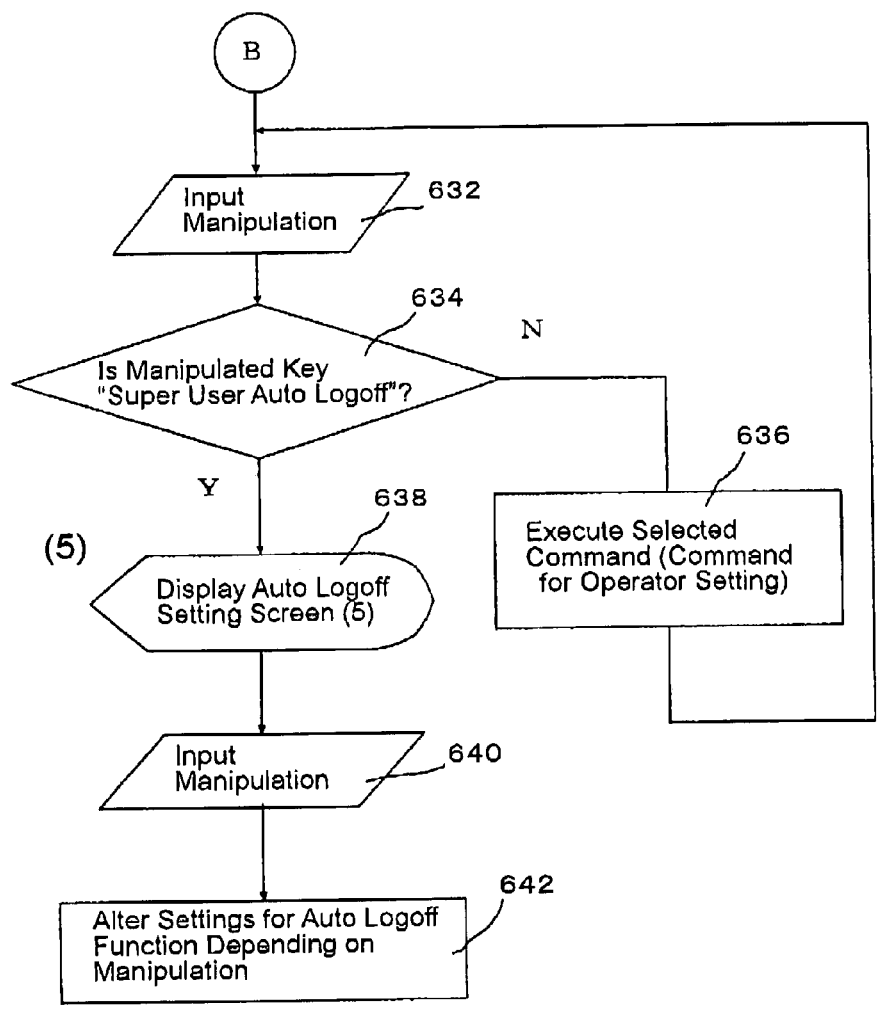
FIG. 8 is a flow chart of the remaining half following FIG. 7.

On the operator setting screen for super user (4), an "Operator Setting" key is depressed, so that the new registration and/or the deletion of any operator (general user) is carried out in accordance with the processing shown in FIG. 8. (steps 632 through 636). Further, the registration or alteration is also done with respect to the authorities of the operators for manipulation.

Figure 13:
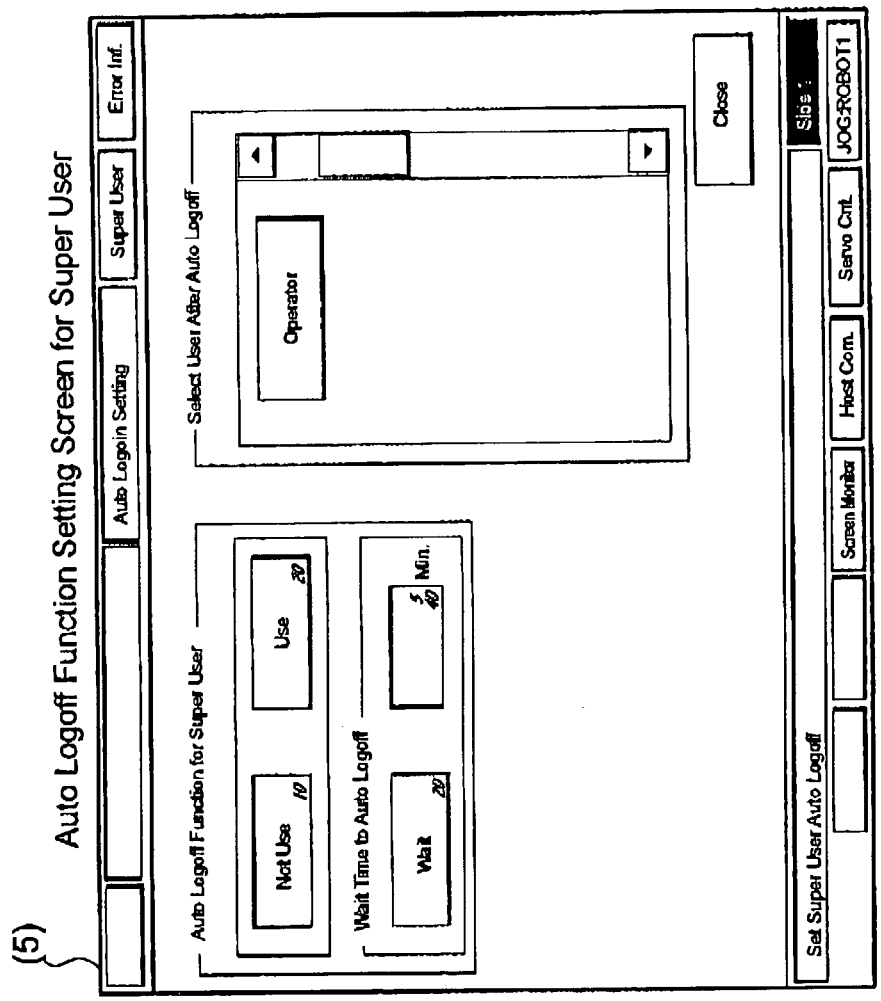
FIG. 13 is a front view showing an example of an auto logoff function setting screen (5) for the super user.

When "Super User Auto Logoff" is selected on the operator setting screen for super user (4) (step 634), the routine moves to an auto logoff function setting screen for super user (5) shown in FIG. 13. (step 638) Switching is possible of whether this function is to be used on the apparatus or not. The time period taken for the auto logoff function to become effective is placed to be settable because it depends on the user's preference. The name of a default user who has the authority for manipulation at the time up is also possible to designate. In this manner, the auto logoff function is to be altered depending on the manipulation by the super user. (steps 640 through 642)

Figure 14:
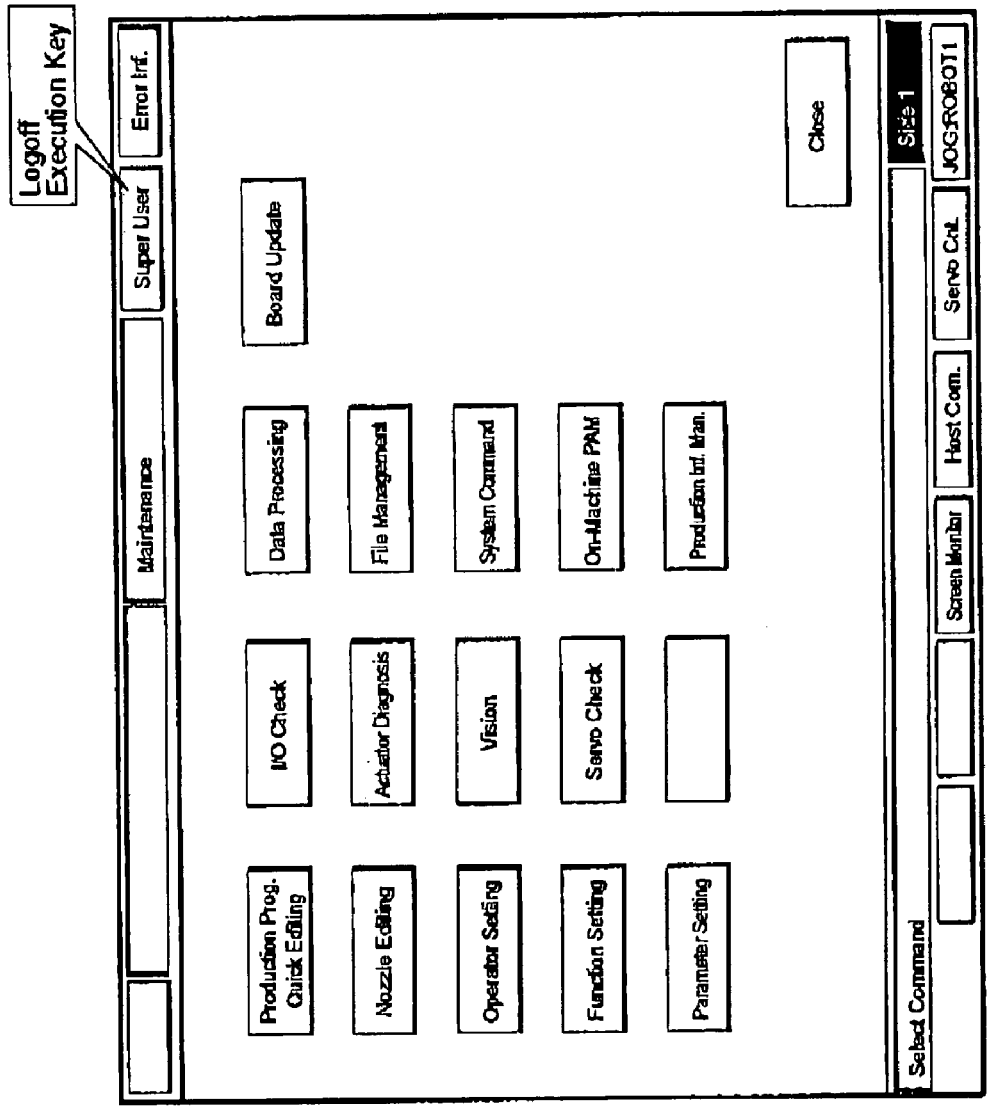
FIG. 14 is a front view showing an example of a screen for executing a usual logging off.

When the usual log-off is to be done after the series of manipulations, a logoff execution key shown in FIG. 14 is manipulated.

Figure 16:
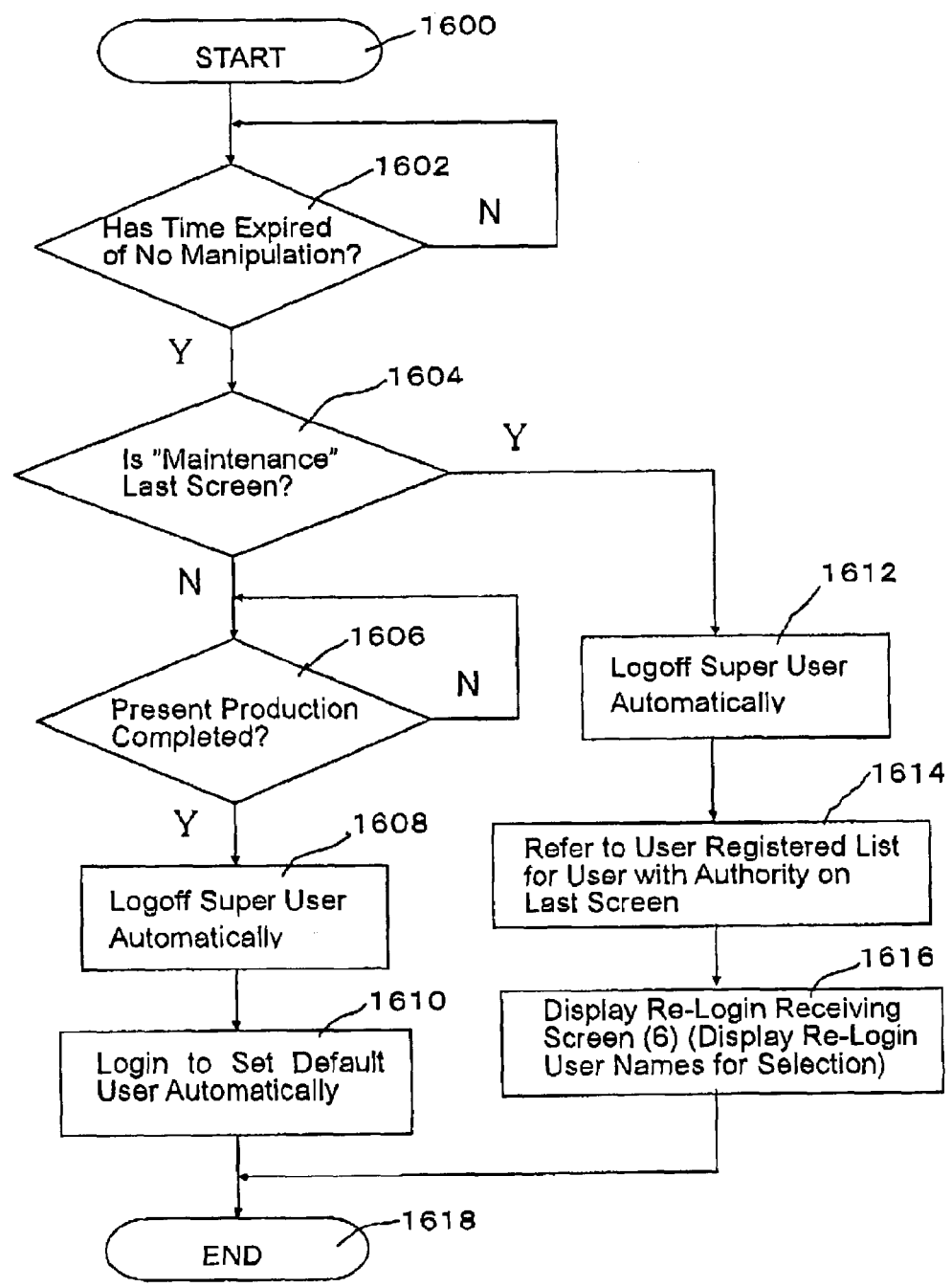
FIG. 16 is a flow chart showing an example of an auto logoff function.

Next, the operation of the auto logoff function will be described hereinafter. FIG. 16 shows the execution flow chart for the auto logoff function. This is the flow chart which is executed in dependence upon the judgment of the control section 21 made when the super user logs in in the case of the default user having been set.

After the starting, judgments are made of whether or not no manipulation has gone on during a predetermined time period (step 1602) and of whether the screen which was last manipulated is "Maintenance" or not. (step 1604) Where the last manipulated screen is "Production", a further judgment is made of whether or not the production being presently executed has completed. That is, because it might be the case that the production operation is still under way, the judgment is made (step 1606) as to whether the production being presently executed has been completed or not (step 1606). When the production operation is judged to have been completed, the super user is automatically logged off (step 1608)

Figure 17:
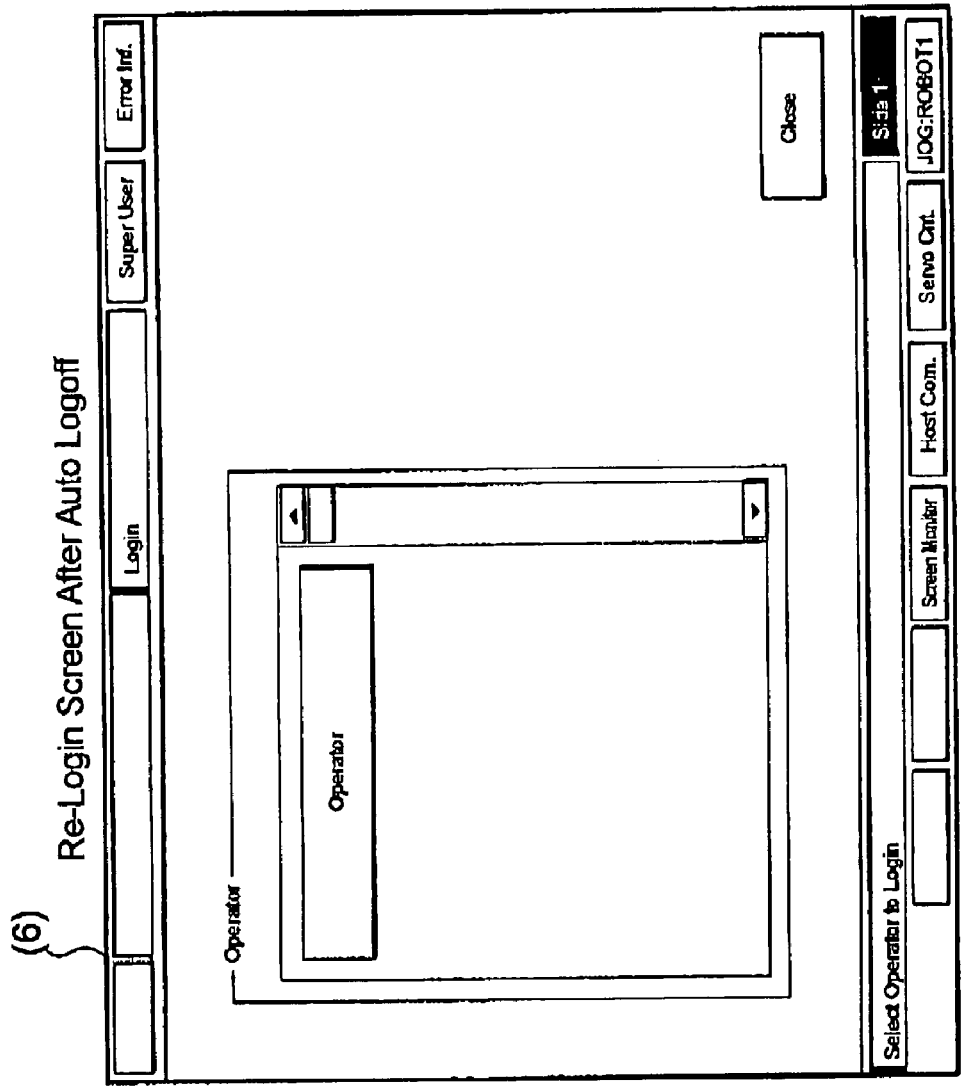
FIG. 17 is a front view showing an example of a re-login accepting screen (6)

If the last manipulated screen is "Maintenance", it cannot be the case that the production operation is under execution, and therefore, the auto logoff is made immediately. That is, the super user is automatically brought into logoff. (step 1612). Further, reference is made to a user registration list to select a user who had the authority for the last manipulated screen. (step 1614) Then, the re-login receiving screen (6) is displayed as shown in FIG. 17, whereby the names of users who are allowed to log in again are displayed for selection. In this case, the super user is selected and displayed as the user who is authorized to log in again. Where the production is to be continued though the super user is present at the job site, the re-login cannot be executed, and therefore, the login is executed after executing the shutdown of the system.

Once the auto logoff and the auto login are executed in this manner, it is difficult or impossible for any general user to call up the supervising/adjusting mode because he or she does not know the password of the line supervisor. Accordingly, the general user is made unable to alter the settings in the supervising/adjusting mode. As a result, the apparatus is prevented from being made inoperative, and the chance to manufacture inferior goods is expected to decrease.

In an auto logoff function setting screen for super user (5) shown in FIG. 13, it can be done to make the auto logoff function ON or OFF (i.e., in use or not in use), to set a time period to be expired until the auto logoff function works and to set a user (anyone of the general users) who is authorized to execute the auto login right after the auto logoff. A default user (who is a general user for whom the least authority for manipulation has been set) who is a general user not specified usually as an individual is set as the user who is authorized for manipulation after the auto login. It is to be noted that setting the general user or the default user to whom the auto login following the auto logoff is destined is not necessarily required.

Figure 18:
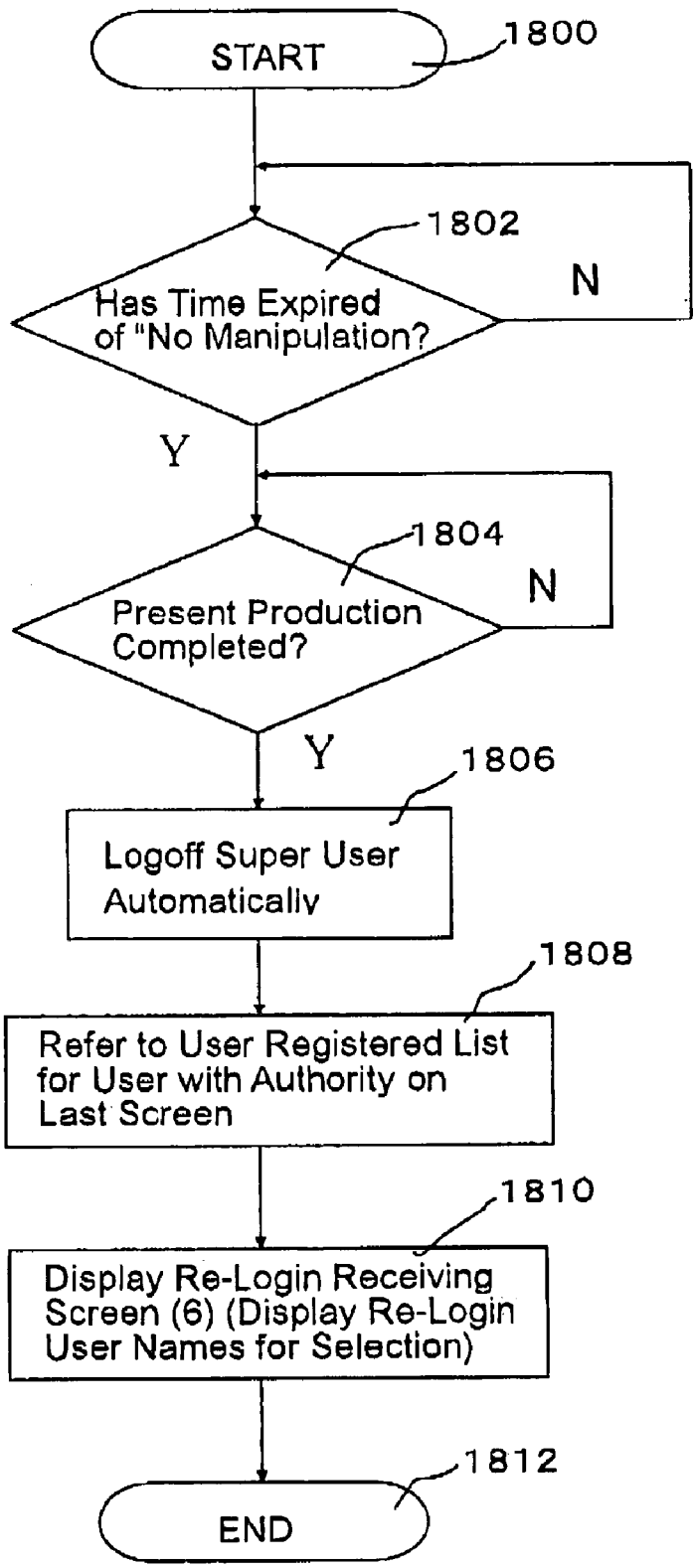
FIG. 18 is a flow chart showing an auto logoff function executed in the case of any default user being not set.

FIG. 18 shows the execution flow chart for the auto logoff function in the case that no default user has been set. More specifically, the flow chart is that which is executed depending upon the judgment of the control section 21 when the super user logs in in the case of the default user having not been set.

After the starting of the routine, a judgment is made (step 1802) of whether or not non-manipulation has gone on for a predetermined time period, and then, another judgment is made (step 1804) of whether or not the production being now performed has been completed. If the judgments are both "yes", then the super user is automatically made log off (step 1806). Further, reference is made to the user registration list to select users who had the authority for the last manipulation screen (step 1808). Further, the re-login receiving screen (6) as shown in FIG. 17 is displayed (step 1810). Since a user who is authorized to manipulate the re-login is selectable on this screen, the users who had the authority to manipulate the last manipulation screen are determined to become the users who could be authorized to manipulate the re-login and are displayed on the re-login receiving screen for selection.

That is, in the case that no default user has been set or that although a default use has been set, the last manipulation screen for the super user is the screen which is included in the maintenance mode, the re-login screen after auto logoff (6) shown in FIG. 17 is displayed right after the auto logoff, so that it becomes possible to accept the re-login.

Where no default user is designated or a default user selected is not authorized to access with the re-login screen (6) shown in FIG. 17 being displayed right after the auto logoff, the routine goes to display the following login screen on which the re-login becomes necessary.

Figure 15:
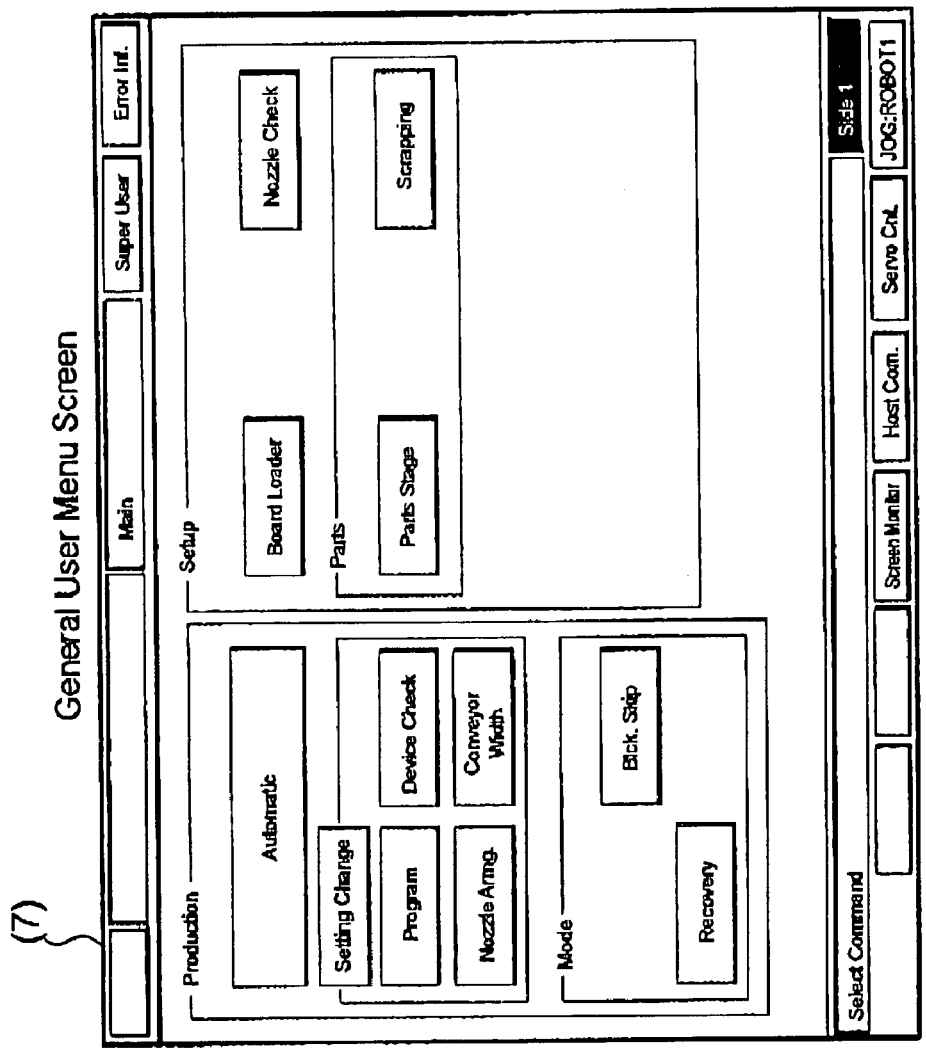
FIG. 15 is a front view showing an example of a menu screen for the general users.

More specifically, on the re-login screen (6) after the execution of the auto logoff, the users who had the authority to access the last manipulation screen on which the auto logoff was executed are displayed to be selected as the user who can enter the re-login (i.e., to be selectable on the "Operator" field). For instance, where the last manipulation screen was the setting screen for altering the "Conveyor Width" of "Production" as shown in FIG. 15, both of the super user and the general user are displayed to be selected as ones who can enter the re-login (provided that of the general users, one who does not have the authority to alter the conveyor width is excluded). Where the last manipulation screen was of those screens included in the "Maintenance" as shown in FIG. 14, the super user only is displayed as one who can enter the re-login.

Referring now back to FIG. 6, if the password input does not specify the super user (step 606), the menu screen for the general users is designated to be displayed. FIG. 15 exemplifies the menu screen (7) appearing when anyone of the general users (including the default user) logs in. The general operators manipulate the production execution section 27 by means of the menu screen (7). No command for "Maintenance" is prepared in this menu screen (7). Further, it may be the case that the authorities of the general operators with respect to the "Production" and the "Setup" are restrained or limited by the super user.

(Other Embodiments or Modifications)

Figure 19:
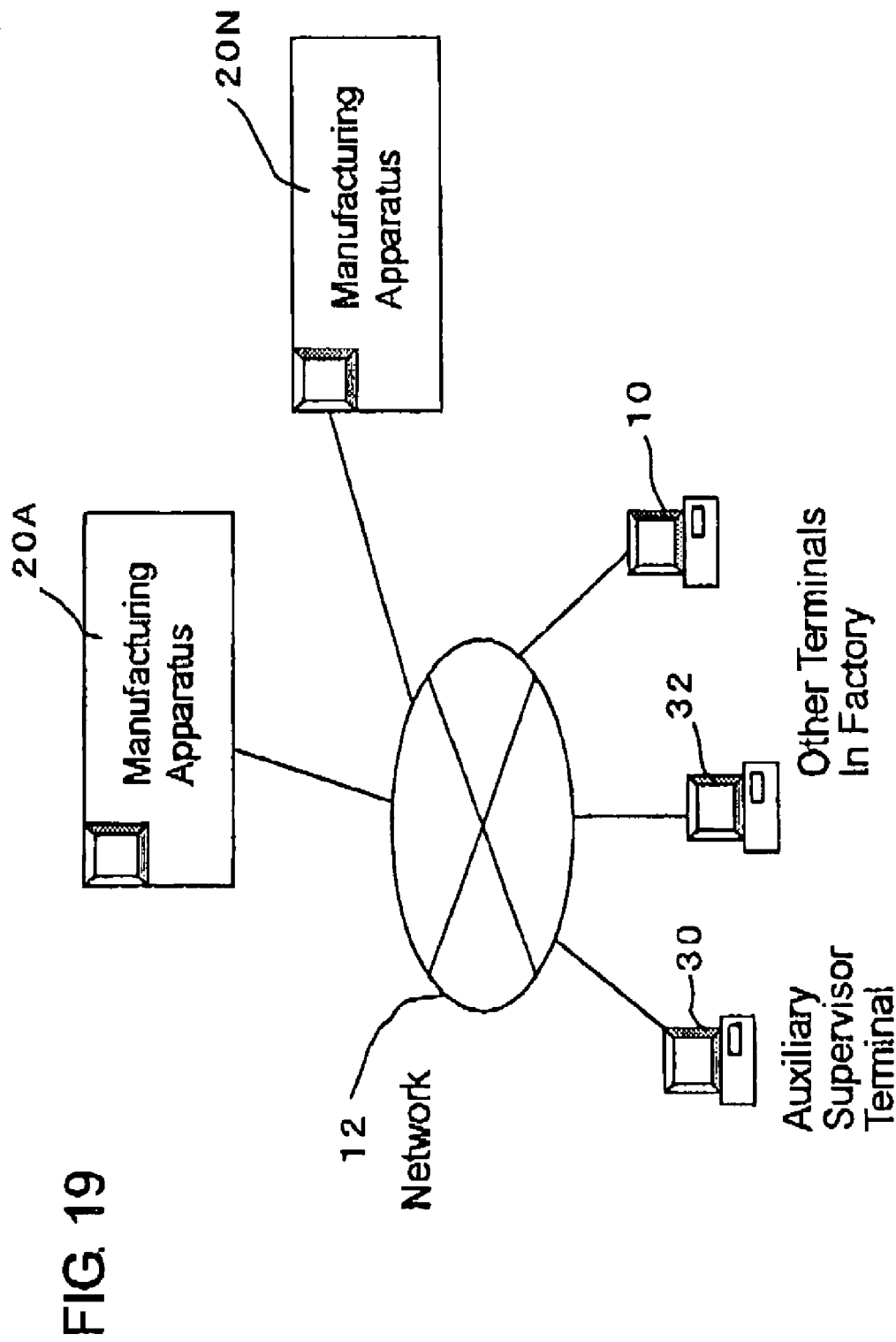
FIG. 19 is an explanatory view of another embodiment or modification according to the present invention.

FIG. 19 shows another embodiment or modification according to the present invention. In this embodiment or modification, the destination to which the auto login is directed in succession to the auto logoff may be a designated user of another computer within the lines 20A through 20N of the manufacturing apparatus 20 or one of designated computer terminals 10, 30, 32 outside the lines 20A through 20N. That is, this embodiment or modification is effective where the plurality of the computers 10, 30, 32 outside the lines 20A through 20N of the manufacturing apparatus 20, together with those of the lines, are connected via the network 12 and an auxiliary supervisor is designated for one of those within the lines 20A through 20N and other computers 10, 30, 32 outside the lines. The designated computer terminals other than the computers within the lines 20A through 20N may include one or more auxiliary supervisor terminals and other terminals within the factory.

As described above, the function to automatically log in to a designated user in succession to the auto logoff according to the present invention is applicable to various other manufacturing apparatus than the circuit board manufacturing apparatus. For example, the function is applicable to those of the kind like a robot system wherein an operator is to be specified. Further, the function is also applicable to those apparatus in other fields than the circuit board manufacturing apparatus if they are of the type wherein users having different authorities are allowed to log in respectively. In other forms of application, the function to automatically log in to a designated user in succession to the auto logoff may be afforded to those computer terminals of the section which carries out the maintenance of manufacturing apparatus or computer terminals for one or more supervisors who are responsible to the manufacturing apparatus which are installed at a remote location for manufacturing related products.

Moreover, the function to automatically log in to a designated user in succession to the auto logoff according to the present invention is not limited to manufacturing apparatus in application field. Rather, the function is applicable to all computer systems of the field in which a plurality of control computers are used connected via a network and wherein an upper supervisor who is given a special authority to supervise the whole of the system coexists with general operators who utilize individual terminals of the system. Also in this case, the same advantages or effects as those of the foregoing embodiment can be achieved by designating an upper supervisor, a default user and general users of the system in advance and by registering data relating to such designation as "registered user data" in a storage device.

Obviously, numerous modifications and variations of the present invention are possible in light of the above teachings. It is therefore to be understood that within the scope of the appended claims, the present invention may be practiced otherwise than as specifically described herein.

What is claimed to be secured by the Letters Patent of the United States is:

1. A method of operating a circuit board manufacturing apparatus including a computer for controlling the apparatus and having a job mode in which a general operator who is given an authority relating to the operation of the apparatus is allowed to manipulate the computer and a supervising/adjusting mode in which the general operator is not authorized to manipulate the computer, but a specified user is authorized to manipulate the computer, the method comprising:

automatically logging off the computer immediately if the manufacturing operation for circuit boards according to a prior instruction has been terminated when a predetermined time period exists with the computer being not manipulated in the supervising/adjusting mode, and automatically logging off the computer after the termination of the manufacturing operation if the manufacturing operation has been continued when the predetermined time period expires with the computer being not manipulated in the supervising/adjusting mode, whereby the general operator is prevented from manipulating the computer in the supervising/adjusting mode;

wherein the circuit board manufacturing apparatus includes a display device having a function to operate as a part of an input/output device and wherein the automatic logoff is effective only on a display screen displayed on the display device in the supervising/adjusting mode, but is not effective in other modes.

2. The method of claim 1, wherein the automatic logoff is executed in the case that the screen on which the last manipulation was carried out is an input screen for supervising and adjusting the circuit board manufacturing apparatus, but is not executed in the case that the screen on which the last manipulation was carried out is a screen for inputting commands relating to the operation of the circuit board manufacturing apparatus.

3. A method of controlling a computer system which includes a plurality of computer terminals connected via a communication network for controlling apparatus and wherein each of the computer terminals is operable in a job mode in which general users who have an authority to operate the computer terminals are allowed to perform the manipulation of the computer terminals and in a supervising/adjusting mode in which the general users are not authorized to manipulate the computer terminals, but a specified user is authorized to manipulate the computer terminals, the method comprising:

enabling one terminal of the computer terminals to be manipulated by the specified user who has completed a login thereto with a certification, automatically logging off the specified user who has logged in, of the one terminal when a predetermined time period expires in the state that the one terminal is not manipulated, whereby the manipulation of the one terminal by the general users in the supervising/adjusting mode is prevented after the predetermined time period expires, and in succession to the automatic logoff, making reference to a user list to select users who have an authority for the last manipulation screen of the one terminal, determining default users who have an authority for re-login, as a result of the selection, and displaying the determined default users on a re-login receiving screen for selection.

4. A program for enabling a computer to execute the following functions with respect to a terminal which is able to be manipulated by a specified user who has completed a login with a certification, when a predetermined time period expires in the state that the terminal is not manipulated;

(a) automatically logging off the specified user having logged in, of the terminal, whereby the manipulation of the terminal by general users in a supervising/adjusting mode is prevented after the predetermined time period expires, (b) in succession to the automatic logoff, making reference to a user registration list to select users who have an authority for the manipulation on a screen manipulated lastly, (c) determining users who have an authority to re-log to the terminal, from the selected users; and (d) displaying the determined users on a re-login receiving screen for selection.

* * * * *